(12) United States Patent
Chang et al.

(10) Patent No.: US 10,508,691 B1
(45) Date of Patent: Dec. 17, 2019

(54) LINEAR GUIDEWAY

(71) Applicant: HIWIN TECHNOLOGIES CORP., Taichung (TW)

(72) Inventors: Lung-Yu Chang, Taichung (TW); Yeh-Wei Lin, Taichung (TW); Xin-Yi Chen, Taichung (TW); Chia-Yu Lin, Taichung (TW); Pin-Ju Huang, Taichung (TW); Stephanie Chun-Ming Yang, Taichung (TW); Zing-Ping Liu, Taichung (TW)

(73) Assignee: Hiwin Technologies Corp., Taichung (TW)

( * ) Notice: Subject to any disclaimer, the term of this patent is extended or adjusted under 35 U.S.C. 154(b) by 0 days.

(21) Appl. No.: 16/389,583

(22) Filed: Apr. 19, 2019

(51) Int. Cl.
| | |
|---|---|
| *F16C 29/06* | (2006.01) |
| *F16C 41/00* | (2006.01) |
| *H01H 35/00* | (2006.01) |
| *F16C 29/00* | (2006.01) |
| *H05K 5/02* | (2006.01) |

(52) U.S. Cl.
CPC .......... *F16C 41/007* (2013.01); *F16C 29/005* (2013.01); *H01H 35/00* (2013.01); *H05K 5/0217* (2013.01); *F16C 2233/00* (2013.01)

(58) Field of Classification Search
CPC .............. F16C 29/0642; F16C 29/0645; F16C 29/0647; F16C 29/065; F16C 29/0659; F16C 29/0661; F16C 29/0664; F16C 29/0666; F16C 41/007; F16C 2233/00
See application file for complete search history.

(56) References Cited

U.S. PATENT DOCUMENTS

| | | | |
|---|---|---|---|
| 7,178,981 B2 | 2/2007 | Rudy et al. | |
| 7,410,299 B2* | 8/2008 | Rudy | .................. G01L 5/0019 384/8 |
| 7,547,141 B2* | 6/2009 | Chen | ....................... F16C 29/00 |
| 10,436,254 B1* | 10/2019 | Lin | ......................... F16C 41/00 |

* cited by examiner

*Primary Examiner* — Phillip A Johnson
(74) *Attorney, Agent, or Firm* — Wang Law Firm, Inc.

(57) ABSTRACT

A linear guideway is characterized in that it is capable of determining whether there is abnormal displacement of the return member based on the open or close of the circuit, and can output the abnormal signal immediately when the circuit is open. Compared with the conventional structure, since the present invention can be disposed only at one end of the slide block, both the number of components and assembly time can be reduced, and the diagnosis with precision and immediacy can be performed without high-deep algorithm, which can play a role of instant reminding before the linear guideway completely loses function. Therefore, the service life of the linear guideway can be known early to avoid the loss caused by the shutdown.

10 Claims, 8 Drawing Sheets

LINEAR GUIDEWAY

BACKGROUND

Field of the Invention

The present invention relates to a linear guideway, and more particularly to a linear guideway capable of determining whether there is abnormal displacement of based on the open or close of a circuit.

Related Prior Art

Please refer to FIG. 1, which is one of the drawings of the linear guideway of the US patent (U.S. Pat. No. 7,178,981 B2), wherein the linear guideway has a rail 1, a slide block 2 disposed on the rail 1, two end covers 3 respectively disposed at two ends of the slide block 2 (only one end of the slide block is shown), and a sensor 4 disposed in each of the end covers 3. The above design is characterized in that the sensor 4 is disposed in each of the end covers 3 to detect the change of the displacement resistance to prevent the abnormal condition of the end covers during the movement of the linear guideway.

It is known that both of the end covers 3 are required to be provided with the sensor 4. Due to the complicated structure, the number of accessories is increased, thereby highlighting the defects of complicated disassembly process and increased maintenance cost, so that more cost is spent on the linear guideway. Moreover, the end covers 3 of the conventional linear guideway have high rigidity, which cannot provide immediate diagnosis, and even has problems such as failure, so that the function of the sensor 4 is weakened. Before the linear guideway completely loses function, it is easy to cause the reading to be inaccurate and cannot be diagnosed immediately, and the damage of the end covers 3 will still occur.

The present invention has arisen to mitigate and/or obviate the afore-described disadvantages.

SUMMARY

One objective of the present invention is to provide a linear guideway, which not only can significantly improve accuracy and immediacy, but also simplifies the configuration of the components, and can simultaneously reduce the manufacturing cost.

To achieve the above objective, a linear guideway in accordance with the present invention comprises:

a rail having two opposite outer rolling grooves formed on an outer peripheral surface thereof;

a slide block having a first end surface, a second end surface opposite to the first end surface, and a slide groove extending through the first and second end surfaces, wherein the slide block is slidably disposed on the rail via the slide groove, and has two opposite inner rolling grooves formed in an inner surface of the slide groove, the inner rolling grooves of the slide block are aligned to and cooperate with the outer rolling grooves of the rail to form a load channel, the slide block further has two opposite non-load channels, and each of the non-load channels extends through the first and second end surfaces of the slide block;

a first end cover disposed on the first end surface of the slide block and having two opposite first return grooves which are respectively connected to one end of the load channel and that of a corresponding one of the non-load channels;

a second end cover including: a cover body disposed on the second end surface of the slide block, and a return member disposed in the cover body and having two opposite second return grooves, wherein the two second return grooves are respectively connected to another end of the load channel and that of the corresponding one of the non-load channels, so that the load channel, the non-load channels, one of the first return grooves and one of the second return grooves together form a circulation path, the cover body has two first electrode portions and two first connecting portions respectively connected to the first electrode portions, the return member further has two second electrode portions that are respectively in electric contact with the first electrode portions to form a close circuit, and two second connecting portions that are respectively connected to the second electrode portions;

a plurality of rolling elements disposed in the two circulation paths; and a circuit board disposed in the cover body of the second end cover, and having a processing module for connecting the first and second connecting portions, when the second electrode portions are separated from the first electrode portions to form an open circuit, the processing module of the circuit board outputs an abnormal signal.

Preferably, each of the first electrode portions has a first electric contact surface, and each of the second electrode portions includes a second electric contact point which is in point contact with a corresponding one of the first electric contact surfaces.

Preferably, the processing module of the circuit board includes two microprocessors and two signal transmission units, and the two microprocessors are respectively connected to the two signal transmission units, the two first connecting portions and the two second connecting portions.

To achieve the above objective, the present invention yet further provides a linear guideway which comprises:

a rail having two opposite outer rolling grooves formed on an outer peripheral surface thereof;

a slide block having a first end surface, a second end surface opposite to the first end surface, and a slide groove extending through the first and second end surfaces, wherein the slide block is slidably disposed on the rail via the slide groove, and has two opposite inner rolling grooves formed in an inner surface of the slide groove, the inner rolling grooves of the slide block are aligned to and cooperate with the outer rolling grooves of the rail to form a load channel, the slide block further has two opposite non-load channels, and each of the non-load channels extends through the first and second end surfaces of the slide block;

a first end cover disposed on the first end surface of the slide block and having two opposite first return grooves which are respectively connected to one end of the load channel and that of a corresponding one of the non-load channels;

a second end cover including an end cover body disposed on the second end surface of the slide block, a cover body on which the end cover body is disposed, and a return member disposed in the cover body and having two opposite second return grooves, wherein the two second return grooves are respectively connected to another end of the load channel and that of a corresponding one of the non-load channels, such that the load channel, the non-load channels, one of the first return grooves and one of the second return grooves form a circulation path, the end cover body includes: two third electrode portions, and two third connecting portions respectively connected to the third electrode portions and penetrating the cover body, the return member further has two second electrode portions respectively in electric contact with the third electrode portions to form a close circuit, and two second connecting portions respectively connected to the second electrode portions;

a plurality of rolling elements disposed in the two circulation paths; and a circuit board disposed in the cover body of the second end cover and having a processing module for connecting the third connecting portions and the second connecting portions, when the second electrode portions are separated from the third electrode portions to form an open circuit, the processing module of the circuit board outputs an abnormal signal.

Preferably, each of the third electrode portions has a third electric contact surface, and each of the second electrode portions has a second electric contact surface which is in surface contact with a corresponding one of the third electric contact surfaces.

Preferably, the processing module of the circuit board includes two microprocessors and two signal transmission units, and the two microprocessors are respectively connected to the two signal transmission units, the two third connecting portions and the two second connecting portions.

To achieve the above objective, the present invention yet further provides a linear guideway which comprises:

a rail having two opposite outer rolling grooves formed on an outer peripheral surface thereof;

a slide block having a first end surface, a second end surface opposite to the first end surface, and a slide groove extending through the first and second end surfaces, wherein the slide block is slidably disposed on the rail via the slide groove, and has two opposite inner rolling grooves formed in an inner surface of the slide groove, the inner rolling grooves of the slide block are aligned to and cooperate with the outer rolling grooves of the rail to form a load channel, the slide block further has two opposite non-load channels, and each of the non-load channels extends through the first and second end surfaces of the slide block;

two return pipe assemblies respectively inserted in the non-load channels, wherein one end of each of the return pipe assemblies has a fourth electrode portion adjacent to the second end surface of the slide block, a fourth connecting portion connected to the fourth electrode portion, and a return channel extending through two ends of each of the return pipe assemblies;

a first end cover disposed on the first end surface of the slide block and having two opposite first return grooves which are respectively connected to one end of the load channel and that of a corresponding one of the return channels;

a second end cover including: a cover body disposed on the second end surface of the slide block and provided for the fourth connecting portions to insert through, and a return member disposed in the cover body and having two opposite second return grooves, wherein the two second return grooves are respectively connected to another end of the load channel and that of a corresponding one of the return channels, so that the load channel, the return channel, one of the first return grooves and one of the second return grooves together form a circulation path, the return member further has two second electrode portions that are respectively in electric contact with the two fourth electrode portions to form a close circuit, and two second connecting portions respectively connected to the second electrode portions;

a plurality of rolling elements disposed in the two return channels; and a circuit board disposed in the cover body of the second end cover and having a processing module for connecting the two fourth connecting portions and the two second connecting portions, when the second electrode portions are separated from the fourth electrode portions to form an open circuit, the processing module of the circuit board outputs an abnormal signal.

Preferably, each of the fourth electrode portions has a fourth electric contact surface, and each of the second electrode portions includes a second electric contact surface that is in surface contact with a corresponding one of the fourth electric contact surfaces.

Preferably, the processing module of the circuit board includes two microprocessors and two signal transmission units, and the two microprocessors are respectively connected to the two signal transmission units, the two fourth connecting portions and the two second connecting portions.

Preferably, each of the return pipe assemblies includes a first return pipe having the fourth connecting portion, and a second return pipe connected to the first return pipe.

By such arrangements, the present invention can determine whether there is abnormal displacement of the return member based on the open or close of the circuit, and can output the abnormal signal immediately when the circuit is open. Compared with the conventional structure, since the present invention can be disposed only at one end of the slide block, both the number of components and assembly time can be reduced, and the diagnosis with precision and immediacy can be performed without high-deep algorithm. The present invention can play a role of instant reminding before the linear guideway completely loses function. Therefore, the service life of the linear guideway can be known early to avoid the loss caused by the shutdown.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there are illustrated preferred embodiments of the invention.

DETAILED DESCRIPTION

Figure 1:
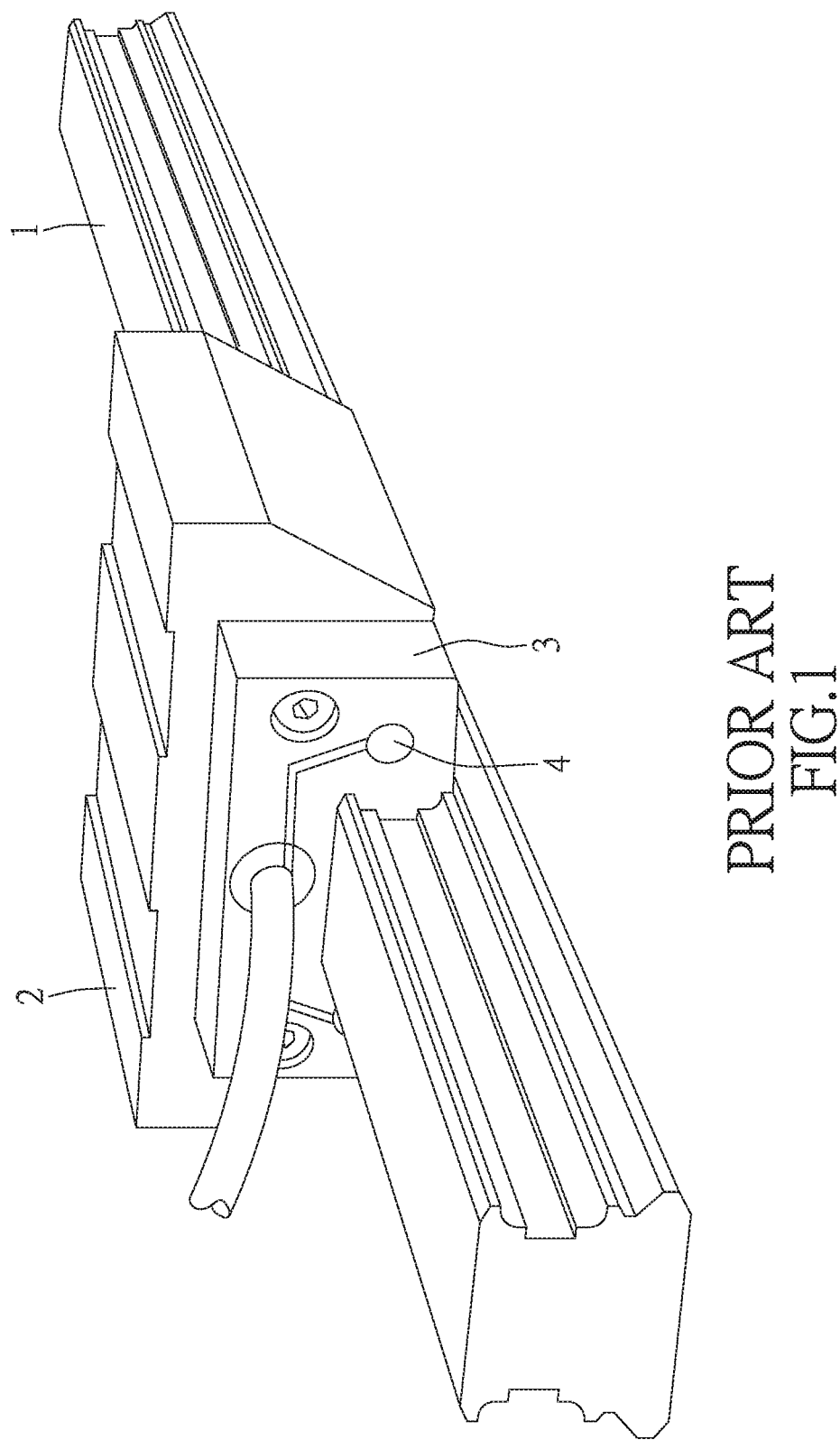
FIG. 1 is one of the drawings showing the linear guideway of the U.S. Patent (U.S. Pat. No. 7,178,981 B2)
Figure 2:
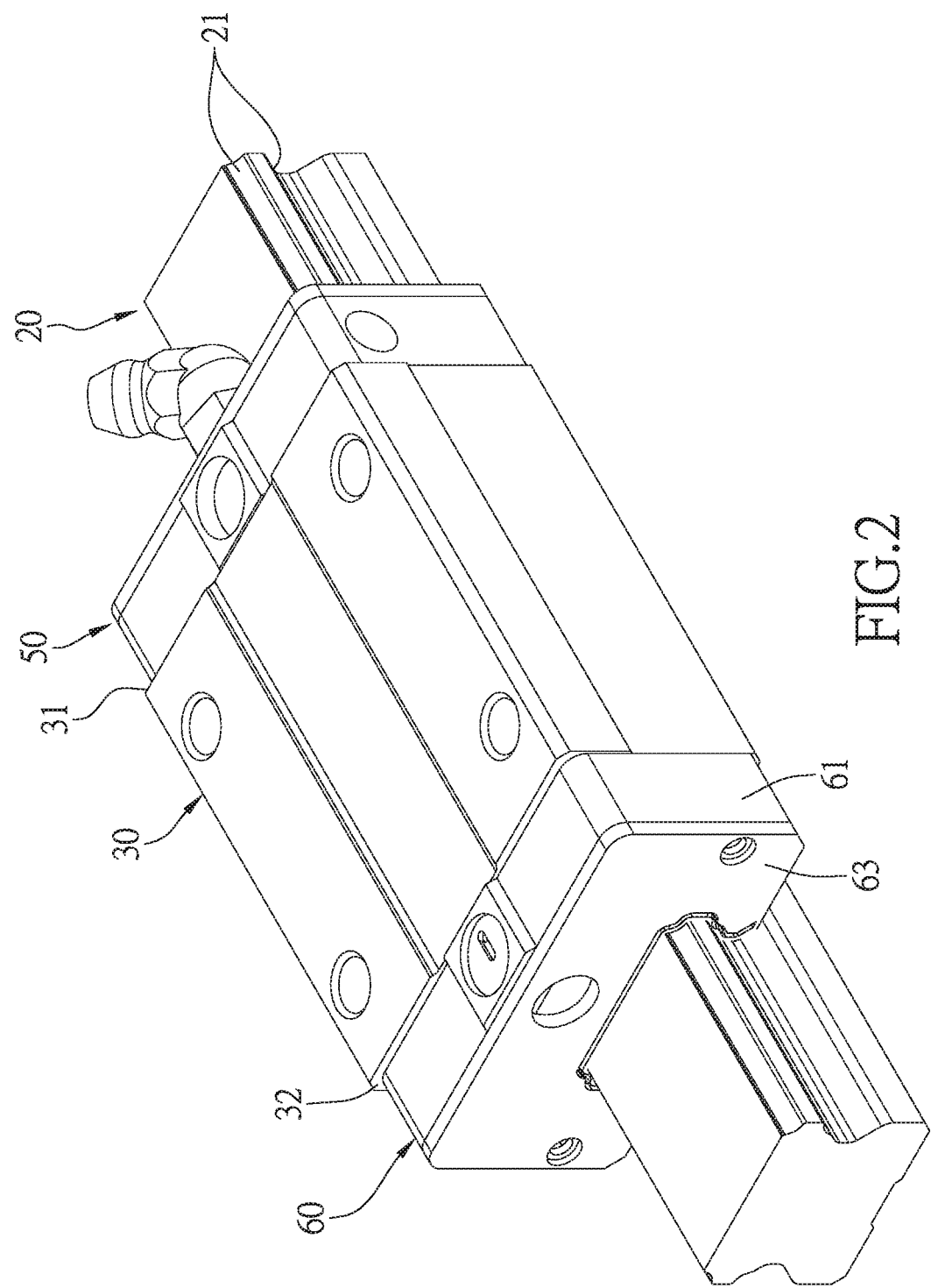
FIG. 2 is a perspective assembled view of the first embodiment of the present invention.

The present invention will be clearer from the following description when viewed together with the accompanying drawings, which show, for purpose of illustrations only, the preferred embodiment in accordance with the present invention.

Referring to FIGS. 2-6, a linear guideway in accordance with a first embodiment of the present invention comprises: a rail 20, a slide block 30, a first end cover 50, a second end cover 60, a plurality of rolling elements 80, and a circuit board 90.

The rail 20 is a rigid and has two opposite outer rolling grooves 21 provided on an outer peripheral surface thereof.

The slide block 30 has a first end surface 31, a second end surface 32 opposite to the first end surface 31, and a slide groove 33 extending through the first and second end surfaces 31, 32. The slide block 30 is slidably disposed on the rail 20 via the slide groove 33, and has two opposite inner rolling grooves 34 formed in an inner surface of the slide groove 33. The inner rolling grooves 34 of the slide block 30 are aligned to and cooperate with the outer rolling grooves 21 of the rail 20 to form a load channel 40. The slide block 30 further has two opposite non-load channels 35, and each of the non-load channels 35 extends through the first and second end surfaces 31, 32 of the slide block 30.

The first end cover 50 is disposed on the first end surface 31 of the slide block 30 and has two opposite first return grooves 51 which are respectively connected to one end of the load channel 40 and that of a corresponding one of the non-load channels 35.

Since the rail 20, the slide block 30, and the first end cover 50 are assembled in a conventional manner, and the manner of operation thereof is the same as the conventional method and is not the key of the present invention, for the structure, the manner of assembly and operation of the components (the rail 20, the slide block 30 and the first end cover 50) are not described in detail.

The second end cover 60 includes: a cover body 61 disposed on the second end surface 32 of the slide block 30, a return member 62 disposed in the cover body 61 and having two opposite second return grooves 621, and a sealing member 63 covering the return member 62 and disposed on one surface of the cover body 61 that faces away from the slide block 30. The cover body 61 is located between the return member 62 and the second end surface 32 in such a manner that the two second return grooves 621 are respectively connected to another end of the load channel 40 and that of a corresponding one of the non-load channels 35, so that the load channel 40, the non-load channel 35, one of the first return grooves 51 and one of the second return grooves 621 together form a circulation path. The cover body 61 has two first electrode portions 611 and two first connecting portions 612 respectively connected to the first electrode portions 611. Each of the first electrode portions 611 has a first electric contact surface 6111, and the return member 62 further has two second electrode portions 622 that are respectively in electric contact with the first electrode portions 611 to form a close circuit, and two second connecting portions 623 that are respectively connected to the second electrode portions 622. Each of the second electrode portions 622 includes a second electric contact point 6221 which is in point contact with a corresponding one of the first electric contact surfaces 6111.

The plurality of rolling elements 80 is disposed in the two circulation paths. In this embodiment, the rolling elements 80 are exemplified by balls.

The circuit board 90 is disposed in the cover body 61 of the second end cover 60, and has a processing module 91 for connecting the first and second connecting portions 612, 623. When the rolling elements 80 strike the two second return grooves 621 to cause the second electrode portions 622 to be separated from the first electrode portions 611 to form an open circuit, the processing module 91 of the circuit board 90 outputs an abnormal signal. In this embodiment, the processing module 91 of the circuit board 90 includes two microprocessors 911, two signal transmission units 912, and a power module 913. The microprocessors 911 are respectively connected to the two signal transmission units 912, the two first connecting portions 612 and the two second connecting portions 623, and the power module 913 is connected to one of the signal transmitting units 912.

In this embodiment, each of the microprocessors 911 includes a central process unit (CPU), a memory unit (RAM and ROM), and an analog-to-digital unit. In the present embodiment, the signal transmission units 912 are connected to an external computer by a wire, but are not limited thereto, and may also include a wireless connection such as a Wi-Fi chip and a Bluetooth chip.

What mentioned above are the structure and way of assembly of the main components of the first embodiment of the present invention.

Figure 5:
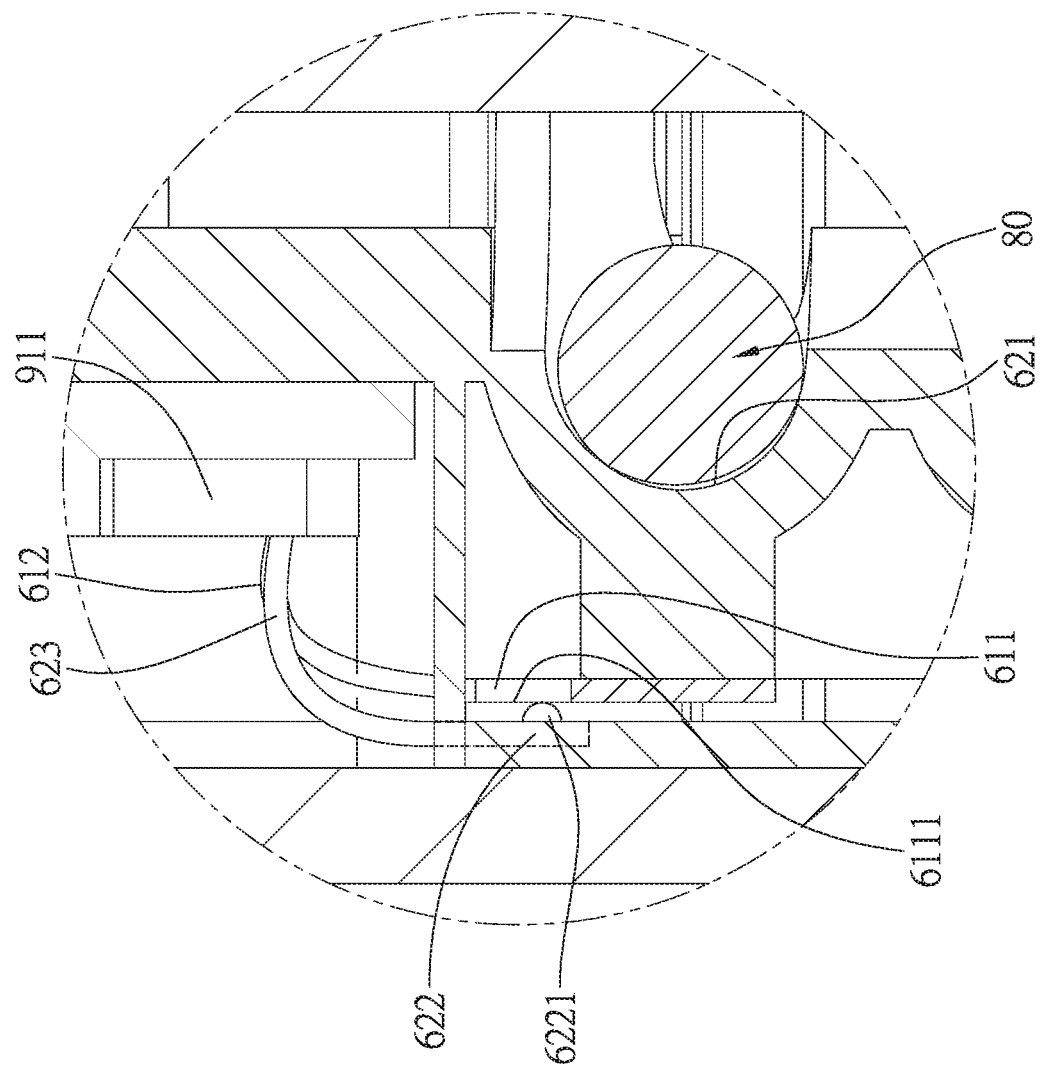
FIG. 5 is a magnified view of the use state of the first embodiment of the present invention, showing a close circuit.

Please refer to FIG. 5, which is a first magnified view of the use state of the first embodiment of the present invention. In the normal state, each of the second electric contact points 6221 is in point contact with the corresponding one of the first electric contact surfaces 6111 to maintain a close circuit, which means that the linear guideway is in good condition.

Figure 6:
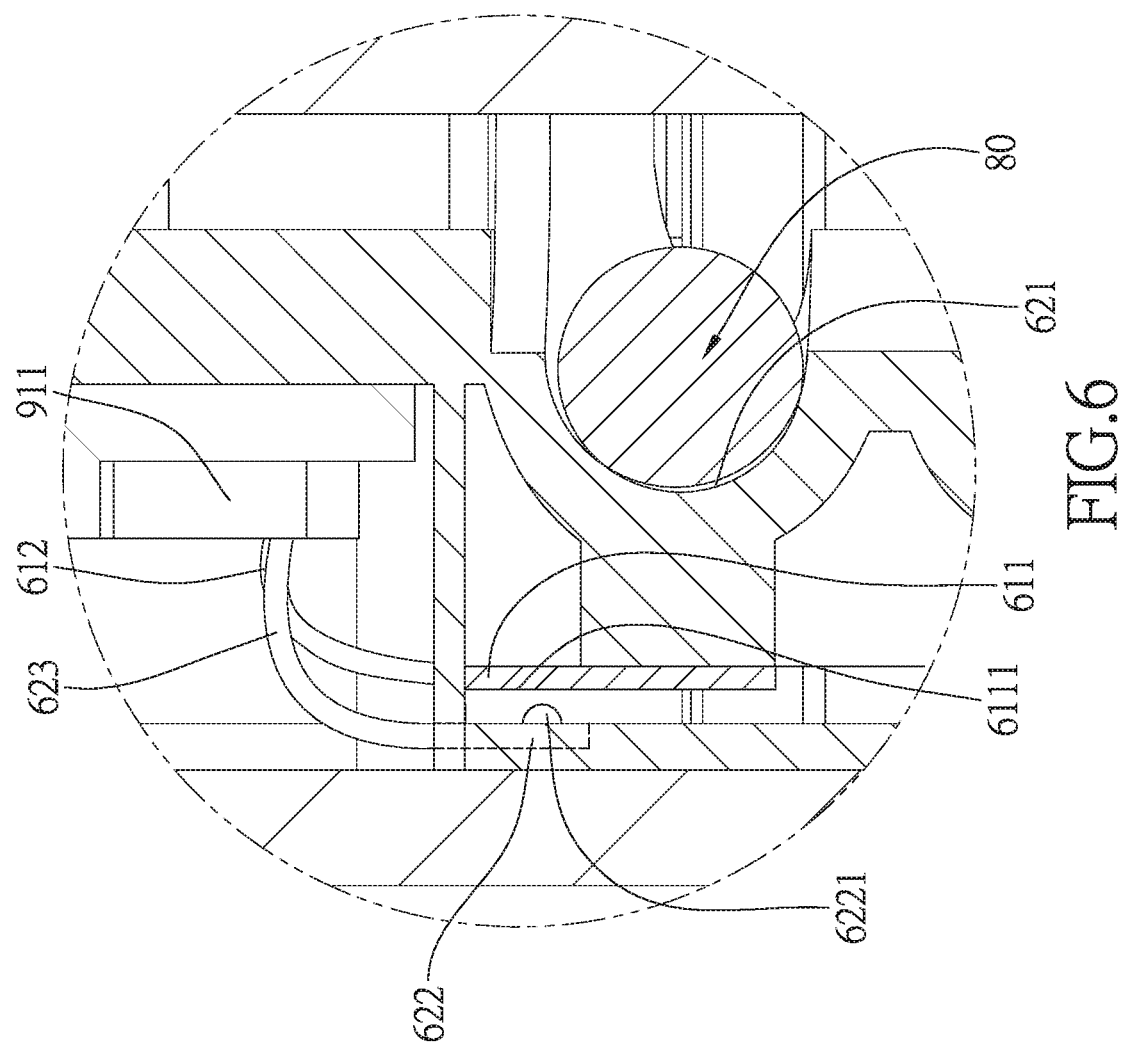
FIG. 6 is another magnified view of the use state of the first embodiment of the present invention, showing an open circuit.

Please refer to FIG. 6, which is second magnified view of the use state of the first embodiment of the present invention. When the return member 62 encounters an abnormal resistance during the operation of the linear guideway, for example, in the event of the slide block 30 losing function, the rolling elements 80 cannot roll smoothly and cause push and collision, and as a result, the second electrode portions 622 are separated from the first electrode portions 611 to form an open circuit, which means that the linear guideway is in an abnormal condition.

Therefore, the present invention determines whether there is abnormal displacement of the second electrode portions 622 of the return member 62 based on the open or close of the circuit, and can output the abnormal signal immediately when the circuit is open. Compared with the conventional structure, since the present invention can be disposed only at one end of the slide block 30, both the number of components and assembly time can be reduced, and the diagnosis with precision and immediacy can be performed without high-deep algorithm. The present invention can play a role of instant reminding before the linear guideway completely loses function. Therefore, the service life of the linear guideway can be known early to avoid the loss caused by the shutdown.

Figure 3:
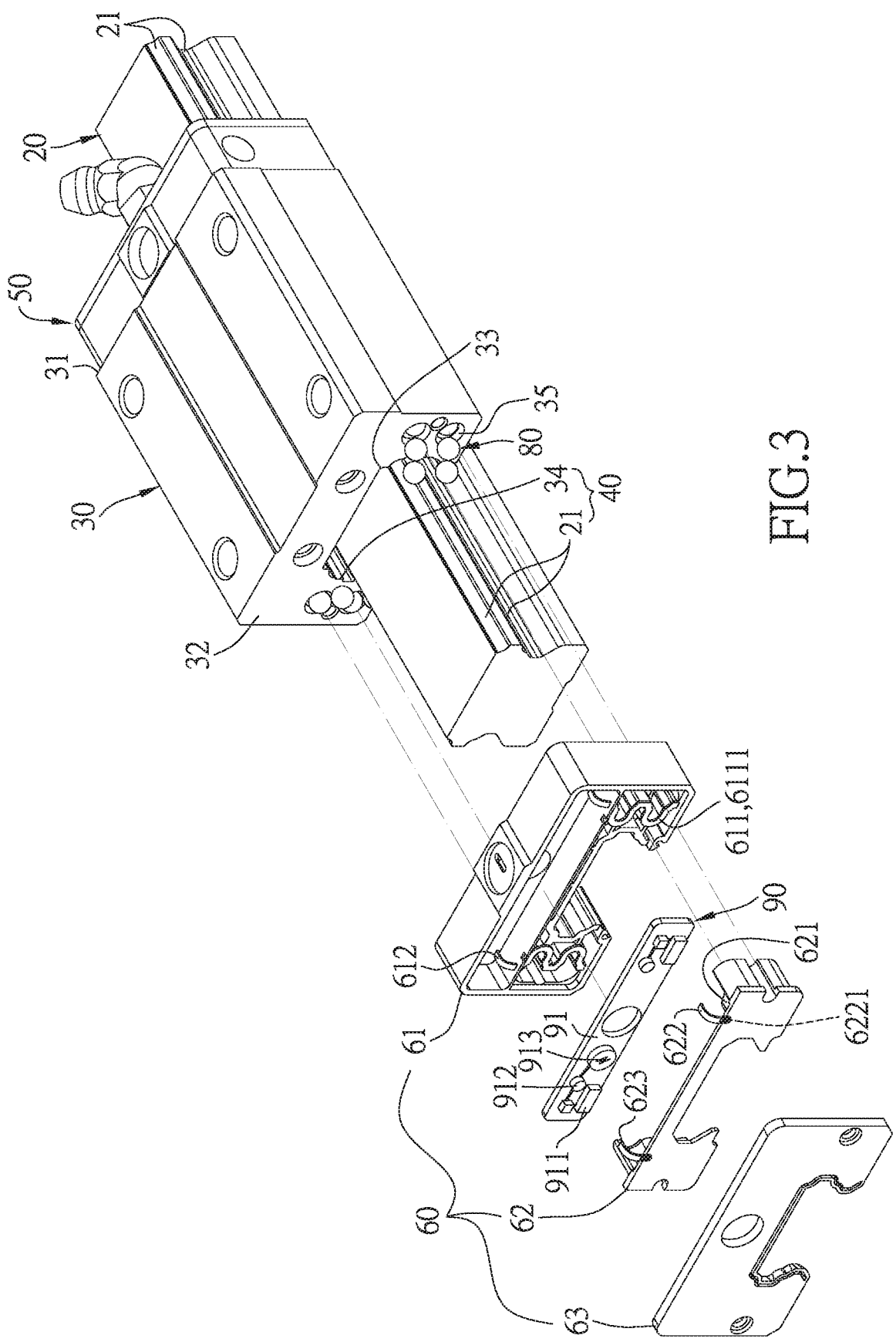
FIG. 3 is an exploded perspective view of the first embodiment of the present invention.
Figure 4:
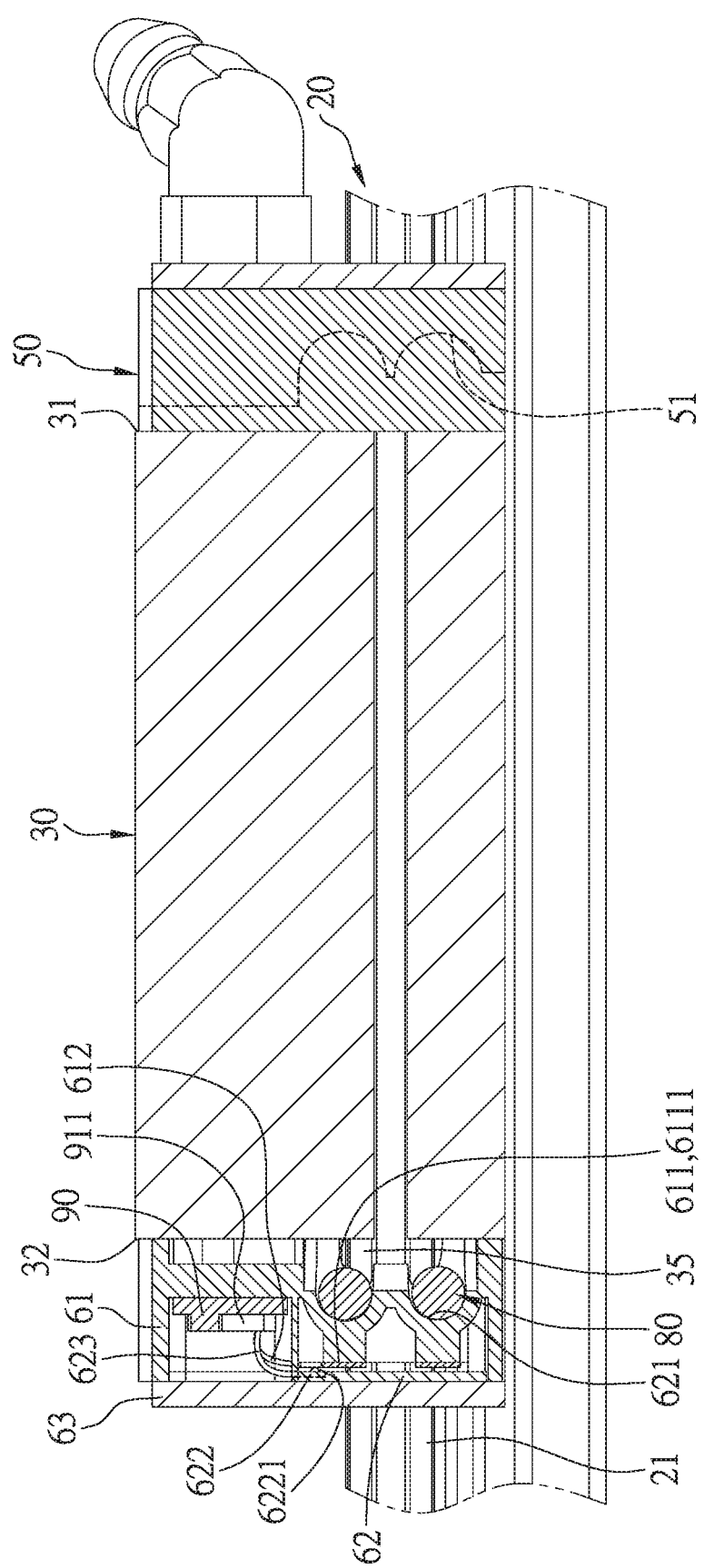
FIG. 4 is a cross-sectional view showing the first embodiment of the present invention.
Figure 7:
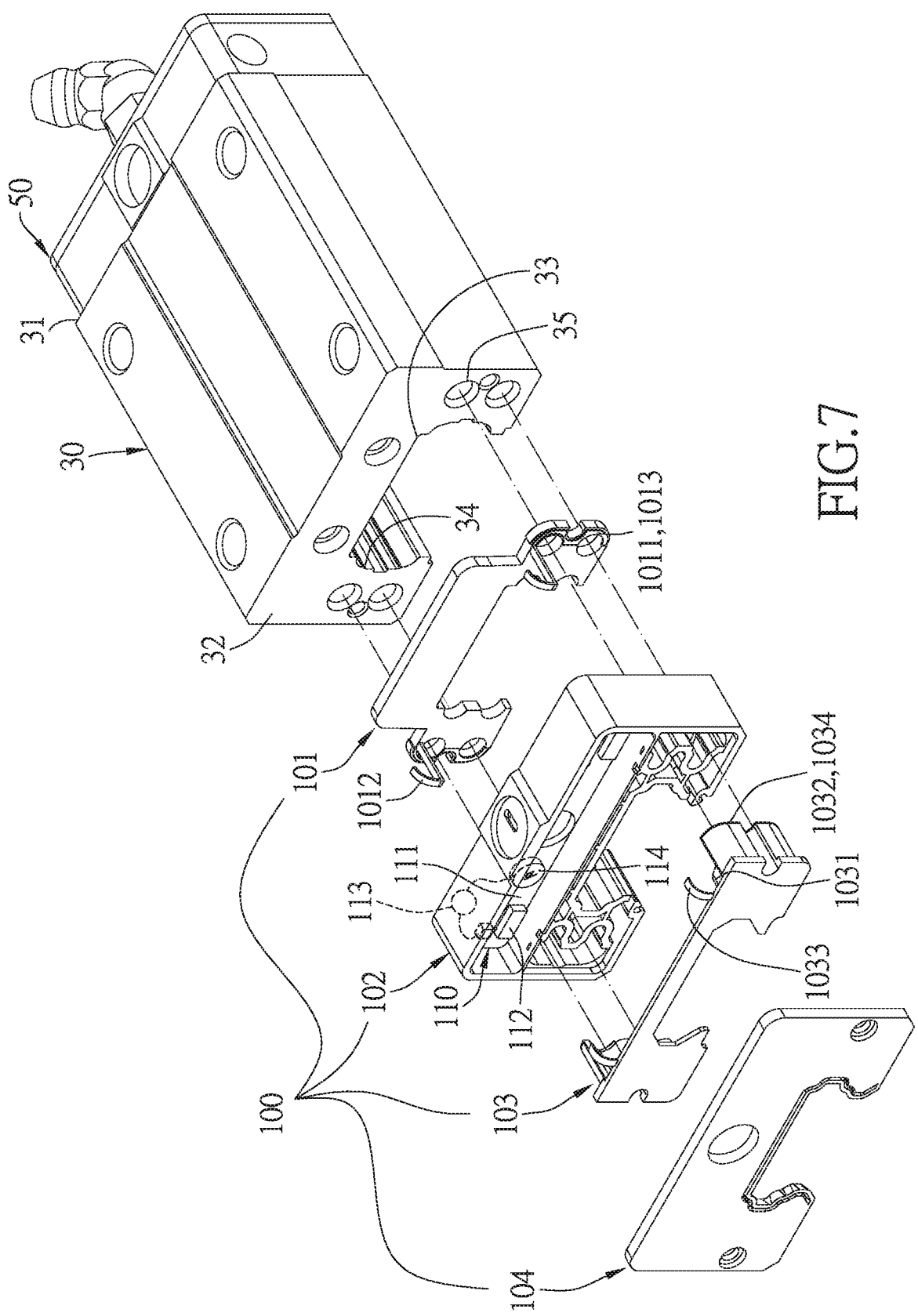
FIG. 7 is an exploded perspective view of a second embodiment of the present invention.

Referring to FIGS. 3 and 7, in order to achieve the foregoing objective, a linear guideway according to a second embodiment of the present invention also comprises: the rail 20, the slide block 30, the first end cover 50 and the rolling elements 80, and is similar to the first embodiment except the following differences:

A second end cover 100 includes: an end cover body 101 disposed on the second end surface 32 of the slide block 30, a cover body 102 on which the end cover body 101 is disposed, a return member 103 disposed in the cover body 102 and having two opposite second return grooves 1031, and a sealing member 104 covering the return member 103 and disposed on one surface of the cover body 102 facing away from the slide block 30. In more detail, the end cover body 101 is located between the cover body 102 and the second end surface 32. The cover body 102 is located between the return member 103 and the end cover body 101, and the two second return grooves 1031 are respectively connected to another end of the load channel 40 and that of a corresponding one of the non-load channels 35, such that the load channel 40, the non-load channel 35, one of the first return grooves 51 and one of the second return grooves 1031 form a circulation path. The end cover body 101 includes: two third electrode portions 1011, and two third connecting portions 1012 respectively connected to the third electrode portions 1011 and penetrating the cover body 102. Each of the third electrode portions 1011 has a third electric contact surface 1013, the return member 103 further has two second electrode portions 1032 respectively in electric contact with the third electrode portions 1011 to form a close circuit, and two second connecting portions 1033 respectively connected to the second electrode portions 1032. Each of the second electrode portions 1032 has a second electric contact surface 1034 which is in surface contact with a corresponding one of the third electric contact surfaces 1013. A circuit board 110 is disposed in the cover body 102 of the second end cover 100 and has a processing module 111 for connecting the third connecting portions 1012 and the second connecting portions 1033. When the rolling elements 80 strike the second return grooves 1031 of the return member 103, causing the second electrode portions 1032 to separate from the third electrode portions 1011 to form an open circuit, the processing module 111 of the circuit board 110 outputs an abnormal signal. In this embodiment, the processing module 111 of the circuit board 110 includes two microprocessors 112, two signal transmission units 113, and a power module 114. The microprocessors 112 are respectively connected to the two signal transmission units 113, the two third connecting portions 1012 and the two second connecting portions 1033, and the power module 114 is connected to the signal transmitting units 113, such that the same effect as described above can also be achieved.

Figure 8:
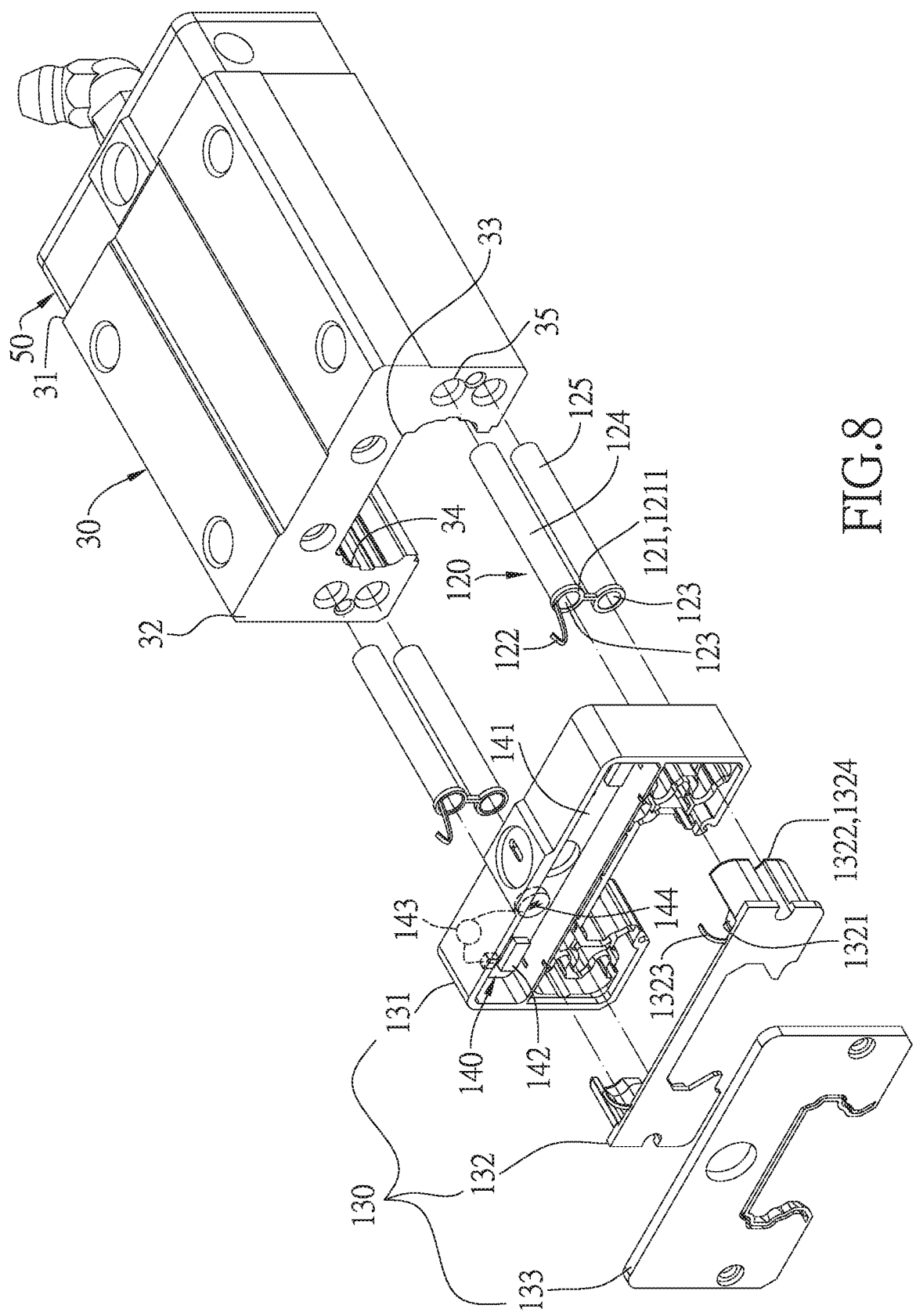
FIG. 8 is an exploded perspective view of a third embodiment of the present invention.

Referring to FIGS. 3 and 8, in order to achieve the foregoing objective, a linear guideway according to a third embodiment of the present invention also comprises: the rail 20, the slide block 30, the first end cover 50 and the rolling elements 80, and is similar to the first embodiment except the following differences:

Two return pipe assemblies 120 are respectively inserted in the non-load channels 35, and one end of each of the return pipe assemblies 120 has a fourth electrode portion 121 adjacent to the second end surface 32 of the slide block 30, a fourth connecting portion 122 connected to the fourth electrode portion 121, and a return channel 123 extending through two ends of each of the return pipe assemblies 120. Each of the fourth electrode portions 121 has a fourth electric contact surface 1211. Each of the return pipe assemblies 120 includes a first return pipe 124 having the fourth connecting portion 122, and a second return pipe 125 connected to the first return pipe 124. A second end cover 130 includes: a cover body 131 disposed on the second end surface 32 of the slide block 30 and provided for the fourth connecting portions 122 to insert through, a return member 132 disposed in the cover body 131 and having two opposite second return grooves 1321, and a sealing member 133 covering the return member 132 and disposed on one surface of the cover body 131 that faces away from the slide block 30. The two second return grooves 1321 are respectively connected to another end of the load channel 40 and that of a corresponding one of the return channels 123, so that the load channel 40, the return channel 123, one of the first return grooves 51 and one of the second return grooves 1321 together form a circulation path. The return member 132 further has two second electrode portions 1322 that are respectively in electric contact with the two fourth electrode portions 121 to form a close circuit, and two second connecting portions 1323 respectively connected to the second electrode portions 1322. Each of the second electrode portions 1322 includes a second electric contact surface 1324 that is in surface contact with a corresponding one of the fourth electric contact surfaces 1211. The plurality of rolling elements 80 is disposed in the two return channels 123. A circuit board 140 is disposed in the cover body 131 of the second end cover 130 and has a processing module 141 for connecting the two fourth connecting portions 122 and the two second connecting portions 1323. When the rolling elements 80 strike the second return grooves 1321 of the return member 132, causing the second electrode portions 1322 to be separated from the fourth electrode portions 121 to form an open circuit, the processing module 141 of the circuit board 140 outputs an abnormal signal. The processing module 141 of the circuit board 140 includes two microprocessors 142, two signal transmission units 143 and a power module 144. The two microprocessors 142 are respectively connected to the second signal transmitting units 143, the two fourth connecting portions 122, and the two second connecting portions 1323, and then the power module 144 is connected to one of the signal transmitting units 143, such that the same effect as above can be achieved.

While we have shown and described various embodiments in accordance with the present invention, it is clear to those skilled in the art that further embodiments may be made without departing from the scope of the present invention.

What is claimed is:

1. A linear guideway comprising:
   a rail having two opposite pair of outer rolling grooves formed on an outer peripheral surface thereof;
   a slide block having a first end surface, a second end surface opposite to the first end surface, and a slide groove extending through the first and second end surfaces, wherein the slide block is slidably disposed on the rail via the slide groove, and has two opposite pair of inner rolling grooves formed in an inner surface of the slide groove, each inner rolling groove of the slide block is aligned to and cooperate with a corresponding one of outer rolling grooves of the rail to form a load channel, the slide block further has two opposite non-load channels, and each non-load channel extends through the first and second end surfaces of the slide block;
   a first end cover disposed on the first end surface of the slide block and having two opposite first return grooves each first return groove is connected to one end of the load channel and that of a corresponding one of the non-load channels;
   a second end cover including: a cover body disposed on the second end surface of the slide block, and a return member disposed in the cover body and having two opposite second return grooves, wherein each second return groove is connected to another end of the load channel and that of the corresponding one of the non-load channels, so that the load channel, the non-load channel, one of the first return grooves and one of the second return grooves together form a circulation path, the cover body has two first electrode portions and two first connecting portions respectively connected to the first electrode portions, the return member further has two second electrode portions that are respectively in electric contact with the first electrode portions to
form a close circuit, and two second connecting portions that are respectively connected to the second
electrode portions;
a plurality of rolling elements disposed in the circulation
path; and
a circuit board disposed in the cover body of the second
end cover, and having a processing module for connecting the first and second connecting portions, when
the second electrode portions are separated from the
first electrode portions to form an open circuit, the
processing module of the circuit board outputs an
abnormal signal.

2. The linear guideway as claimed in claim 1, wherein
each of the first electrode portions has a first electric contact
surface, and each of the second electrode portions includes
a second electric contact point which is in point contact with
a corresponding one of the first electric contact surfaces.

3. The linear guideway as claimed in claim 1, wherein the
processing module of the circuit board includes two microprocessors and two signal transmission units, and the two
microprocessors are respectively connected to the two signal
transmission units, the two first connecting portions and the
two second connecting portions.

4. A linear guideway comprising:
a rail having two opposite pair of outer rolling grooves
formed on an outer peripheral surface thereof;
a slide block having a first end surface, a second end
surface opposite to the first end surface, and a slide
groove extending through the first and second end
surfaces, wherein the slide block is slidably disposed
on the rail via the slide groove, and has two opposite
pair of inner rolling grooves formed in an inner surface
of the slide groove, each inner rolling groove of the
slide block is aligned to and cooperate with a corresponding one of the outer rolling grooves of the rail to
form a load channel, the slide block further has two
opposite non-load channels, and each non-load channel
extends through the first and second end surfaces of the
slide block;
a first end cover disposed on the first end surface of the
slide block and having two opposite first return grooves
each first return groove is connected to one end of the
load channel and that of a corresponding one of the
non-load channels;
a second end cover including an end cover body disposed
on the second end surface of the slide block, a cover
body on which the end cover body is disposed, and a
return member disposed in the cover body and having
two opposite second return grooves, wherein each
second return groove is connected to another end of the
load channel and that of a corresponding one of the
non-load channels, such that the load channel, the
non-load channel, one of the first return grooves and
one of the second return grooves form a circulation
path, the end cover body includes: two third electrode
portions, and two third connecting portions respectively connected to the third electrode portions and
penetrating the cover body, the return member further
has two second electrode portions respectively in electric contact with the third electrode portions to form a
close circuit, and two second connecting portions
respectively connected to the second electrode portions;
a plurality of rolling elements disposed in the circulation
path; and
a circuit board disposed in the cover body of the second
end cover and having a processing module for connecting the third connecting portions and the second
connecting portions, when the second electrode portions are separated from the third electrode portions to
form an open circuit, the processing module of the
circuit board outputs an abnormal signal.

5. The linear guideway as claimed in claim 4, wherein
each of the third electrode portions has a third electric
contact surface, and each of the second electrode portions
has a second electric contact surface which is in surface
contact with a corresponding one of the third electric contact
surfaces.

6. The linear guideway as claimed in claim 4, wherein the
processing module of the circuit board includes two microprocessors and two signal transmission units, and the two
microprocessors are respectively connected to the two signal
transmission units, the two third connecting portions and the
two second connecting portions.

7. A linear guideway comprising:
a rail having two opposite pair of outer rolling grooves
formed on an outer peripheral surface thereof,
a slide block having a first end surface, a second end
surface opposite to the first end surface, and a slide
groove extending through the first and second end
surfaces, wherein the slide block is slidably disposed
on the rail via the slide groove, and has two opposite
pair of inner rolling grooves formed in an inner surface
of the slide groove, each inner rolling groove of the
slide block is aligned to and cooperate with a corresponding one of the outer rolling grooves of the rail to
form a load channel, the slide block further has two
opposite non-load channels, and each non-load channel
extends through the first and second end surfaces of the
slide block;
a return pipe assembly respectively inserted in each
non-load channel, wherein one end of the return pipe
assembly has a fourth electrode portion adjacent to the
second end surface of the slide block, a fourth connecting portion connected to the fourth electrode portion, and a return channel extending through two ends
of the return pipe assembly;
a first end cover disposed on the first end surface of the
slide block and having two opposite first return grooves
each first return groove is connected to one end of the
load channel and that of the return channel;
a second end cover including: a cover body disposed on
the second end surface of the slide block and provided
for the fourth connecting portions to insert through, and
a return member disposed in the cover body and having
two opposite second return grooves, wherein each
second return groove is respectively connected to
another end of the load channel and that of the return
channel, so that the load channel, the return channel,
one of the first return grooves and one of the second
return grooves together form a circulation path, the
return member further has two second electrode portions that are respectively in electric contact with the
two fourth electrode portions to form a close circuit,
and two second connecting portions respectively connected to the second electrode portions;
a plurality of rolling elements disposed in the return
channel; and
a circuit board disposed in the cover body of the second
end cover and having a processing module for connecting the two fourth connecting portions and the two
second connecting portions, when the second electrode portions are separated from the fourth electrode portions to form an open circuit, the processing module of the circuit board outputs an abnormal signal.

8. The linear guideway as claimed in claim 7, wherein each of the fourth electrode portions has a fourth electric contact surface, and each of the second electrode portions includes a second electric contact surface that is in surface contact with a corresponding one of the fourth electric contact surfaces.

9. The linear guideway as claimed in claim 7, wherein the processing module of the circuit board includes two microprocessors and two signal transmission units, and the two microprocessors are respectively connected to the two signal transmission units, the two fourth connecting portions and the two second connecting portions.

10. The linear guideway as claimed in claim 7, wherein each return pipe assembly includes a first return pipe having the fourth connecting portion, and a second return pipe connected to the first return pipe.

* * * * *